(12) United States Patent
Nguyen et al.

(10) Patent No.: US 7,976,319 B2
(45) Date of Patent: Jul. 12, 2011

(54) SURFACE MOUNT ELECTRICAL CONNECTOR HAVING FLEXIBLE SOLDER TAILS

(75) Inventors: Hung Thai Nguyen, Harrisburg, PA (US); Brent D. Yohn, Newport, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 101 days.

(21) Appl. No.: 12/164,847

(22) Filed: Jun. 30, 2008

(65) Prior Publication Data

US 2009/0325407 A1 Dec. 31, 2009

(51) Int. Cl.
*H01R 12/00* (2006.01)
(52) U.S. Cl. .......................................... 439/83; 439/876
(58) Field of Classification Search .................. 439/83, 439/876, 79
See application file for complete search history.

(56) References Cited

U.S. PATENT DOCUMENTS

| | | | |
|---|---|---|---|
| 4,447,109 A | 5/1984 | Hobart, Jr. | |
| 5,746,608 A | 5/1998 | Taylor | |
| 5,975,963 A * | 11/1999 | Higuchi et al. | 439/851 |
| 6,491,536 B1 * | 12/2002 | Torii | 439/246 |
| 6,533,590 B1 * | 3/2003 | Lee et al. | 439/83 |
| 6,652,294 B1 * | 11/2003 | Zhang | 439/83 |
| 6,857,184 B2 * | 2/2005 | Ju | 29/876 |
| 7,086,913 B2 * | 8/2006 | Myer et al. | 439/876 |
| 7,097,470 B2 | 8/2006 | Harper, Jr. | |
| 7,179,094 B2 | 2/2007 | Kawahara et al. | |
| 7,297,007 B2 * | 11/2007 | Hao | 439/83 |
| 7,338,298 B2 * | 3/2008 | Lappoehn | 439/83 |
| 7,458,828 B2 * | 12/2008 | Pavlovic | 439/83 |
| 2003/0186571 A1 | 10/2003 | Lin | |
| 2005/0064745 A1 | 3/2005 | Zhang | |
| 2006/0068640 A1 | 3/2006 | Gailus | |
| 2006/0135003 A1 | 6/2006 | Peloza | |
| 2006/0258191 A1 * | 11/2006 | Chen | 439/83 |
| 2008/0076277 A1 | 3/2008 | Chen | |

OTHER PUBLICATIONS

International Search Report, International Application No. PCT/US2009/003779, International Filing Date Jun. 25, 2009.

\* cited by examiner

*Primary Examiner* — Hien Vu

(57) ABSTRACT

An electrical connector includes a housing having a mating end and a board end. The housing has a plurality of contact cavities extending along a longitudinal axis between the mating and board ends. A plurality of contacts are received within the contact cavities. The contacts have a mating end and a mounting end, and the contacts have a flexible tail at the mounting end. The tail has a first portion extending along the longitudinal axis and a second portion angled with respect to the first portion with the second portion having a board mounting surface configured to mount to a circuit board. The tail includes a slot open along the board mounting surface.

19 Claims, 6 Drawing Sheets

SURFACE MOUNT ELECTRICAL CONNECTOR HAVING FLEXIBLE SOLDER TAILS

BACKGROUND OF THE INVENTION

The subject matter herein relates generally to surface mounted electrical connectors, and more particularly to surface mounted electrical connectors that include flexible solder tails.

In recent years, surface mounted electrical connectors mounted using surface mount technology have gained popularity for interconnecting circuit boards because the connectors make electrical connections to many elements on the circuit board, the connectors have high contact densities, and other advantages. The connector is electrically connected to the circuit board by soldering ends of each of the contacts provided inside a housing of the connector to a pad on a surface of the circuit board.

Known surface mounted electrical connectors are not without disadvantages. For instance, when the circuit board mounted with the connector is used in harsh environments, such as in military applications, aerospace applications, automobile applications, and the like, the circuit board is subjected to harsh conditions. For example, thermal stress and/or vibrations can cause stress on the contacts and the solder connecting the contacts and the pads on the circuit board. The stress and/or vibrations may cause the connector to become partially or wholly disconnected from the circuit board.

Additional problems arise with high density connectors in that the bonding surface for each terminal may be limited. For example, the size of the contact may be reduced within high density connectors to accommodate more contacts within a given envelope and/or the amount of real estate on the circuit board is limited in high density applications. As a result, the amount of solder that bonds the contact to the board may be limited, which may exaggerate the problems associated with thermal stress and/or vibrations.

Other problems associated with known surface mounted electrical connectors arise from the difficulty of arranging the contacts, the housing and/or the circuit board properly during assembly. For example, component tolerances and/or manufacturing process variations may cause the contacts, the housing and/or the circuit board to be misaligned with one another. Generally, the contacts are typically oriented coplanar with the circuit board for proper surface mounting. However, when the contacts are not coplanar with the circuit board, a gap may be created between the contact and the circuit board, which may or may not be filled by the solder to effectively bond the contact to the pad on the circuit board.

A need remains for surface mounted electrical connectors that may be manufactured and/or assembled in a cost effective and reliable manner. A need remains for surface mounted electrical connectors that provide reliable connections with the circuit board, even during use in harsh environments.

BRIEF DESCRIPTION OF THE INVENTION

In one embodiment, an electrical connector is provided including a housing having a mating end and a board end. The housing has a plurality of contact cavities extending along a longitudinal axis between the mating and board ends. A plurality of contacts are received within the contact cavities. The contacts have a mating end and a mounting end, and the contacts have a flexible tail at the mounting end. The tail has a first portion extending along the longitudinal axis and a second portion angled with respect to the first portion with the second portion having a board mounting surface configured to mount to a circuit board. The tail includes a slot open along the board mounting surface.

Optionally, the slot may extend along the first portion and the second portion, and the slot may extend through the tail. The tail may include first and second legs separated from one another to define the slot. The slot may be configured to receive solder for soldering to the circuit board. Optionally, the contacts may be initially loaded into the contact cavities such that the second portion is angled at an acute angle with respect to the first portion. The housing may be mounted to the circuit board such that the tails are flexed such that the second portion is angled at approximately a right angle with respect to the first portion. The tails may be deflected as the housing is mounted to the circuit board such that the second portion is biased against the circuit board to ensure contact with the circuit board during soldering of the tails to the circuit board. Optionally, the contact cavities may be box shaped and include four walls of substantially equal width, wherein the first portion extends along one of the walls. The contact cavities may be arranged in a plurality of rows and a plurality of columns, with the contacts received in the contact cavities such that each contact in a column faces in a common direction and adjacent contacts within a row face in different directions.

In another embodiment, a contact is provided for surface mounting to a circuit board. The contact includes a main body having box-shape that extends along a contact axis. The main body has a mating interface with at least four discrete contact points configured to engage a mating contact. A flexible tail extends from the main body and the tail includes a first portion extending along the contact axis and a second portion angled with respect to the first portion. The second portion has a board mounting surface configured to mount to the circuit board, wherein the tail includes a slot open along the board mounting surface.

In a further embodiment, an electrical connector is provided that includes a housing having a mating end and a board end configured for mounting to a circuit board. The housing has a plurality of contact cavities extending along a longitudinal axis between the mating and board ends. The housing has a locating post extending from the board end, and the locating post is configured to be interference fit within holes in the circuit board. A plurality of contacts are received within the contact cavities. Each contact has a mating end and a mounting end, and each contact has a flexible tail at the mounting end. The tail has a board mounting surface configured to mount to the circuit board, wherein the tail is deflected as the contact is mounted to the circuit board such that the tail is biased against the circuit board. The interference fit between the locating post and the circuit board is great enough to overcome the bias forces of the contacts to hold the housing in position relative to the circuit board during soldering.

DETAILED DESCRIPTION OF THE INVENTION

Figure 1:
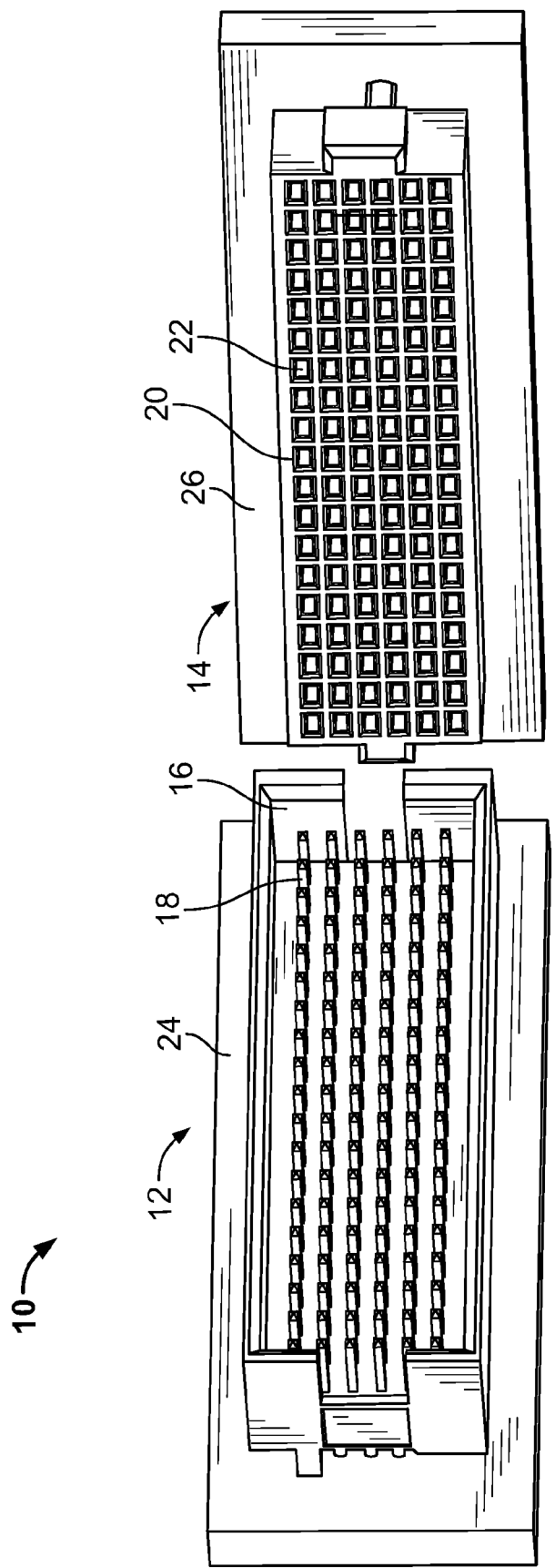
FIG. 1 illustrates an electrical connector system including a header connector and a receptacle connector.

FIG. 1 illustrates an electrical connector system 10 including a header connector 12 and a receptacle connector 14 formed in accordance with an exemplary embodiment. The header connector 12 includes a housing 16 and a plurality of header contacts 18 held within the housing 16. The receptacle connector 14 includes a housing 20 and a plurality of socket contacts 22 held within the housing 20. The header and receptacle connectors 12, 14 are mated with one another such that the header contacts 18 mate with the socket contacts 22.

In an exemplary embodiment, the header connector 12 is mounted to a first circuit board 24 and the receptacle connector 14 is mounted to a second circuit board 26. As such, the connector system 10 is a board-to-board connector system that interconnects the circuit boards 24, 26. In an exemplary embodiment, the first circuit board 24 represents a PCI Mezzanine Card (PMC) or Switched Mezzanine Card (XMC), and the second circuit board represents a carrier card or carrier circuit board. The header connector 12 may represent a mezzanine connector and the receptacle connector 14 may represent a carrier connector. In alternative embodiments, the header connector 12 and/or the receptacle connector 14 may be cable mounted rather than board mounted. In other alternative embodiments, at least one of the circuit boards 24, 26 may be daughter cards or daughter boards.

Figure 2:
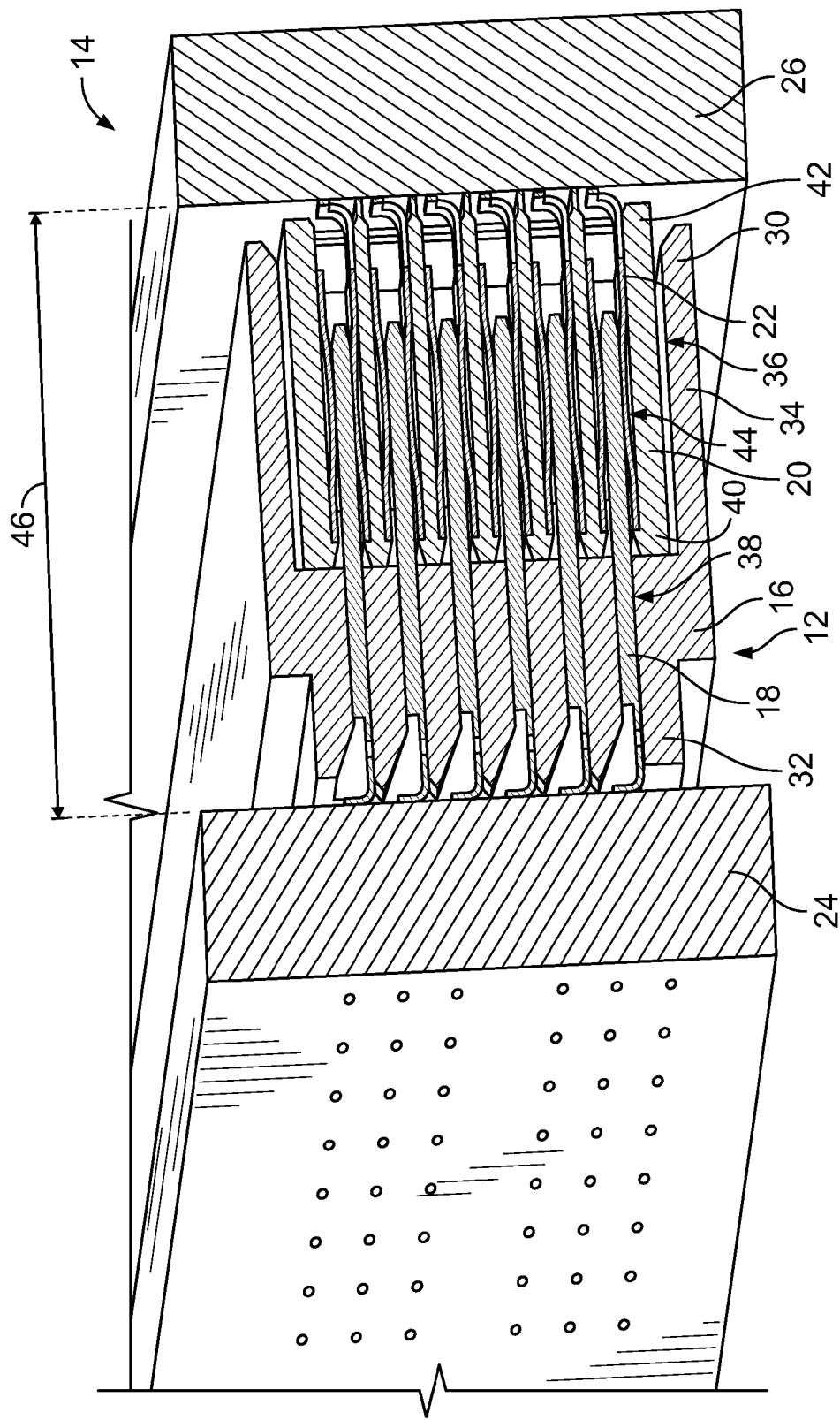
FIG. 2 is a cross-sectional view of the receptacle connector mated with the header connector.

FIG. 2 is a cross-sectional view of the receptacle connector 14 mated with the header connector 12. The header connector housing 16 extends between a mating end 30 and a board end 32. The housing 16 is mounted to the first circuit board 24 at the board end 32. The housing 16 includes a shroud 34 at the mating end 30 that defines a mating cavity 36 that receives the receptacle connector 14. The housing 16 includes a plurality of contact cavities 38 that receive the header contacts 18. In an exemplary embodiment, the header contacts 18 define pins or posts that extend beyond the contact cavities 38 into the mating cavity 36. The header contacts 18 are mated with the socket contacts 22 in the mating cavity 36. In the illustrated embodiment, the header contacts 18 are surface mounted to the circuit board 24.

The receptacle connector housing 20 extends between a mating end 40 and a board end 42. The housing 20 is mounted to the second circuit board 26 at the board end 42. The housing 20 includes a plurality of contact cavities 44 that receive the socket contacts 22. In an exemplary embodiment, the socket contacts 22 define receptacles that receive the header contacts 18 therein. The socket contacts 22 are surrounded by the contact cavities 44 and the header contacts 18 are received in the contact cavities 44 when the connectors 12, 14 are mated. In the illustrated embodiment, the socket contacts 22 are surface mounted to the circuit board 26. When mated, the circuit boards 24, 26 are separated from one another by a stack height 46. Different connectors 12, 14 may be used to control the stack height 46.

Figure 3:
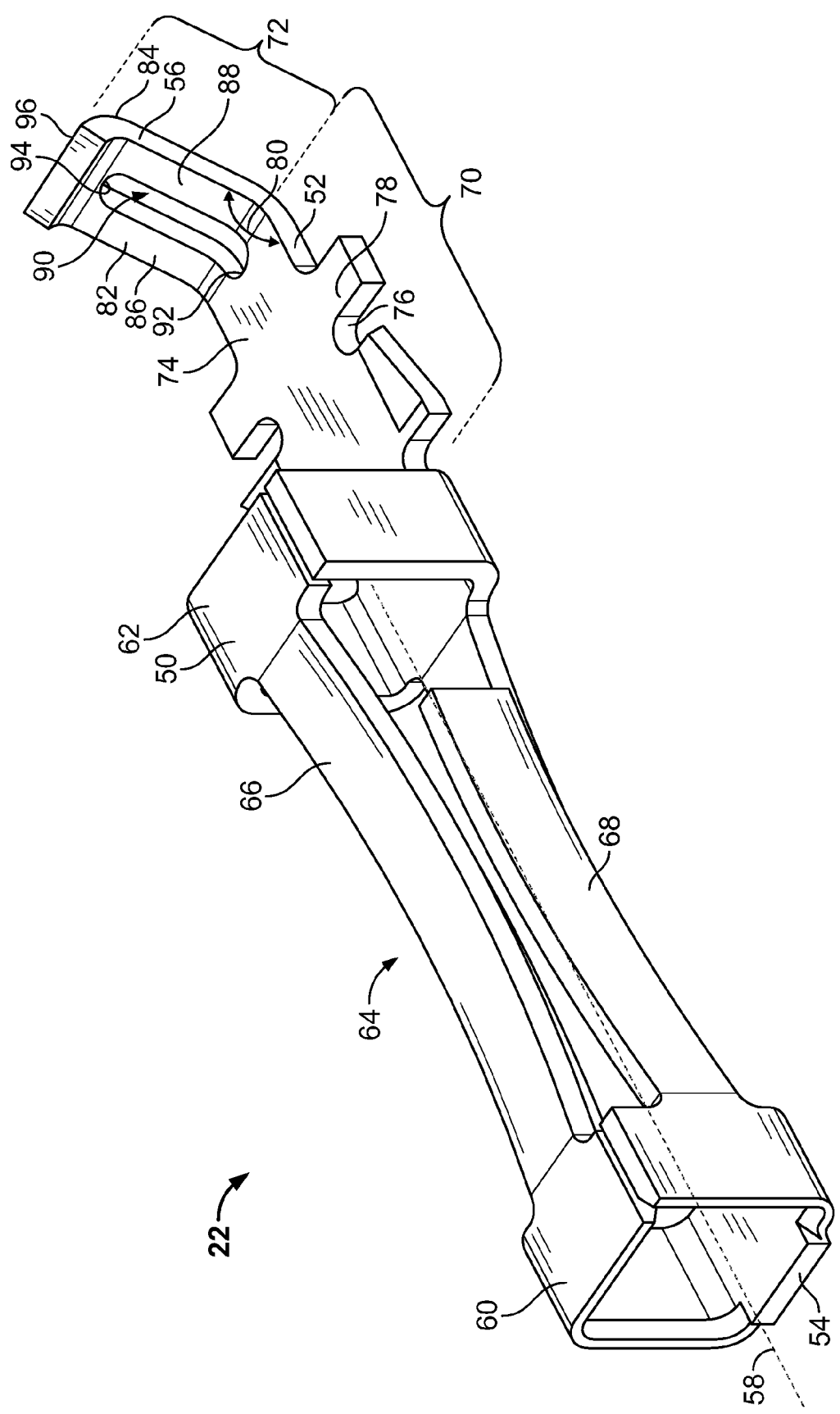
FIG. 3 is a perspective view of a contact for use with the receptacle connector shown in FIG. 1.

FIG. 3 is a perspective view of one of the socket contacts 22 for use with the receptacle connector 14 (shown in FIG. 1). The socket contact 22 includes a main body 50 and a flexible tail 52. The contact 22 extends between a mating end 54 and a mounting end 56. The tail 52 is arranged at the mounting end 56. The main body 50 extends along a contact axis 58 between a first collar 60 and a second collar 62. The main body 50 includes beams 64 extending at least partially between the collars 60, 62. The collars 60, 62 and beams 64 defining a box-shaped receptacle for receiving the header contact 18 (shown in FIG. 1). Optionally, the socket contact 22, including the main body 50, is stamped and formed into the box shape, however alternative means and processes may be used to manufacture the socket contact 22.

In an exemplary embodiment, the beams 64 include both primary beams 66 and secondary beams 68. The primary beams 66 connect the first and second collars 60, 62 and thus define simply supported beams. The secondary beams 68 extend from one of the collars 60, 62 toward the other collar 60, 62 but do not connect with the other collar 60, 62. In the illustrated embodiment, two primary beams 66 are provided that are opposed from one another and two secondary beams 68 are provided that are opposed from one another. The secondary beams 68 both extend from the first collar 60 toward the second collar 68. Each of the beams 64 are inwardly curved or bowed toward the receptacle. The inward bow of the beams 64 allows the beams 64 to engage the header contact 18 when the header contact 18 is inserted into the receptacle. In an exemplary embodiment, the beams 64 define a mating interface with at least four discrete contact points configured to engage the header contact 18. For example, each beam 64 may define a contact point for the mating interface. The multiple contact points ensures good electrical connection between the contacts 22, 18.

The tail 52 extends from the main body 50 proximate the mounting end 56. The tail 52 is integrally formed with the main body 50, but may be separately provided in alternative embodiments. Optionally, the tail 52 may extend from the second collar 62. The tail 52 includes a first portion 70 extending along the contact axis 58 and a second portion 72 angled with respect to the first portion 70. Optionally, the first portion 70 may extend from one of the walls defining the box-shaped main body 50 such that the first portion 70 is generally coplanar with one of the walls (e.g. wall of the collar and/or one of the beams 64) of the main body 50. The first portion 70 includes an inner surface 74 and an outer surface 76. In an exemplary embodiment, the first portion 70 includes a pair of pegs 78 that extend outward therefrom. The first portion 70 may include retention barbs 79 that extend outward therefrom.

The second portion 72 extends from the first portion 70 at an angle 80. Optionally, the angle 80 may be an acute angle and formed such that the second portion 72 is angled generally toward the contact axis 58 from the first portion 70. As will be described in further detail below, the second portion 72 forms a spring. Optionally, the first and second portions 70, 72 may cooperate to define a spring. The second portion 72 includes an inner surface 82 and an outer surface 84. In an exemplary embodiment, the outer surface 84 defines a board mounting surface and when the contact 22 is mounted to the circuit board 26 (shown in FIG. 1), the board mounting surface extends along and engages the circuit board 26.

The second portion 72 includes first and second legs 86, 88 separated from one another to define a slot 90. Optionally, the slot 90 may extend entirely through the second portion 72 between the inner and outer surfaces 82, 84. Alternatively, the slot 90 may be open to the outer or board mounting surface 84 and extend only partially from the outer surface 84 to the inner surface 82. The slot 90 has a top 92 and a bottom 94. The legs 86, 88 are connected at the end of the tail 52 to define the bottom 94 of the slot 90, however, the slot 90 may extend all the way to the end of the tail 52 in alternative embodiments. The top 92 of the slot 90 may be positioned generally at the intersection of the first and second portions 70, 72, however the top 92 may be positioned in either the first portion 70 in an alternative embodiment such that the slot 90 extends at least partially along the first portion 70. The intersection of the first and second portions 70, 72 is generally defined at the deflected forming the angle 80. The tail 52 includes a tip 96 at the distal end of the tail 52. Optionally, the tip 96 may be curved.

Figure 4:
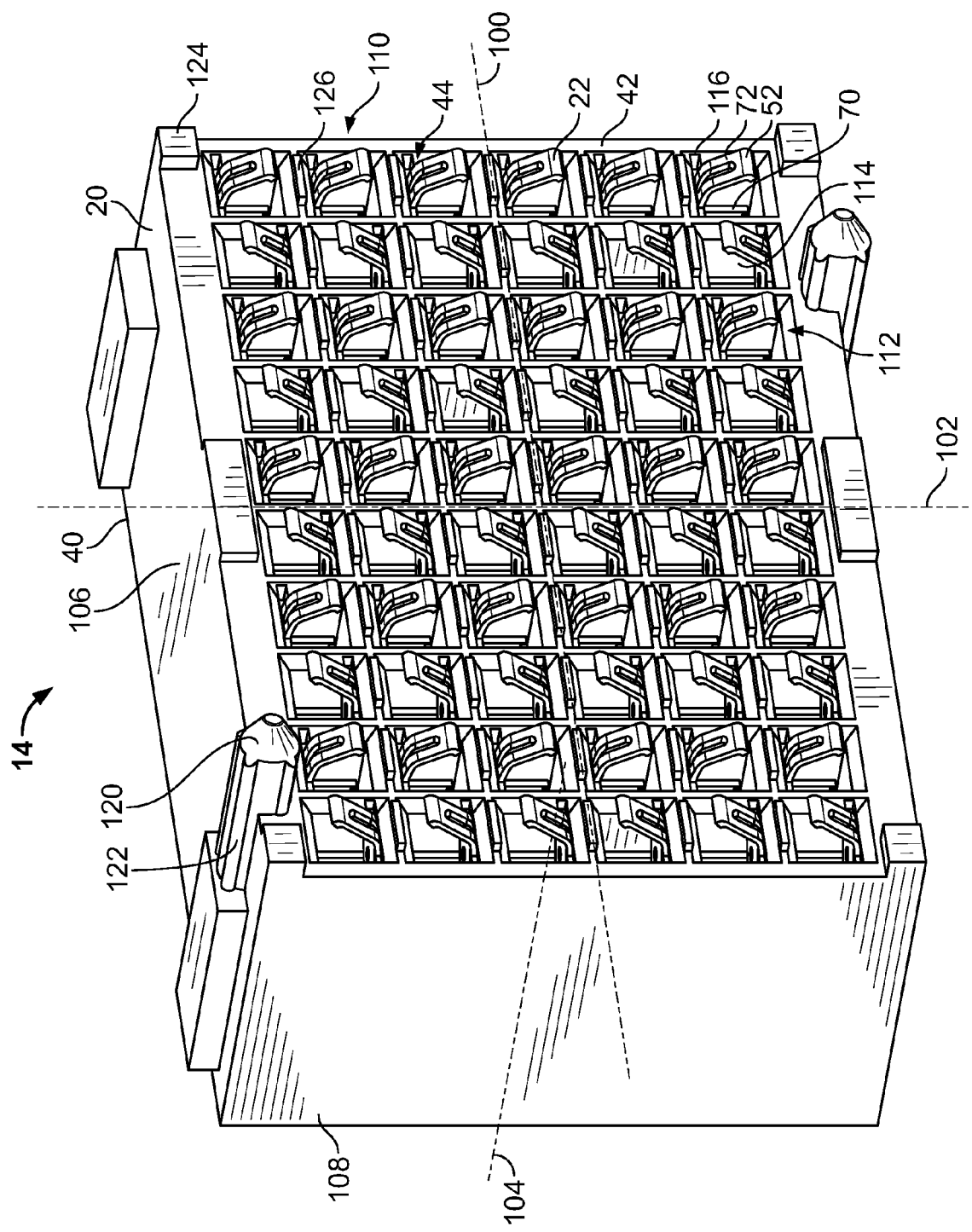
FIG. 4 is a rear perspective view of the receptacle connector with the contacts loaded therein.

FIG. 4 is a rear perspective view of the receptacle connector 14 with the socket contacts 22 loaded therein illustrating the contact cavities 44 extending from the board end 42 toward the mating end 40. The housing 20 is rectangular and elongated in a longitudinal direction along a longitudinal axis 100. The housing 20 also has a transverse axis 102. The longitudinal axis 100 and transverse axis 102 are both orthogonal to cavity axes 104 that extend along the contact cavities 44. The housing 20 includes longitudinal sides 106 and lateral sides 108 that extend along the longitudinal and lateral axes 100, 102, respectively.

In an exemplary embodiment, the contact cavities 44 are arranged as a matrix of cavities in a plurality of rows 110 and columns 112. The rows 110 extend along the longitudinal axis 100 and the columns 112 extend along the lateral axis 102. In the illustrated embodiment, the housing 20 includes a greater number of columns 112 than rows 110, however, alternative embodiments may include the same number of rows 110 and columns 112, or may include more rows 110 than columns 112. In the illustrated embodiment, six rows 110 are provided and ten columns 112 are provided, however any number of rows 110 and columns 112 may be provided in alternative embodiments.

In an exemplary embodiment, the contact cavities 44 have a square cross-section defined by four interior walls 114 having approximately equal widths. The contact cavities 44 may have different shapes in alternative embodiments, such as to accommodate differently shaped contacts 22. In an exemplary embodiment, each contact cavity 44 includes a groove 116 formed in at least one of the interior walls 114. The groove 116 is sized and shaped to receive the pegs 78 (shown in FIG. 3). The pegs 78 and/or retention barbs 79 may be received in the grooves 116 by an interference fit to secure the contact 22 within the contact cavity 44.

The contacts 22 are received in the contact cavities 44 such that the tails 52 extend at least partially out of the board end 42 of the contact cavities 44. Optionally, the first portions 70 may be entirely housed within the contact cavities 44 and only the second portions 72 extends outward from the contact cavities 44. In an exemplary embodiment, the contacts 22 are arranged within the contact cavities 22 such that each contact 22 within a column 112 is similarly positioned within the contact cavities of the respective column 112. The contacts 22 in adjacent columns 22 are arranged differently, such as in an opposite orientation. The first portions 70 of the contacts within a column 112 are each arranged along the same interior wall 114 of the contact cavity 44 (e.g. the wall 114 closest to one of the sides 106 for one column 112 and the wall 114 closest to the other of the sides 106 for the other column 112). The second portions 72 of the contacts within a column 112 each extend in a common direction, and the second portions 72 in adjacent columns 112 extend in different, opposite directions. As such, within each row 110, adjacent contacts 22 are arranged differently. For example, each adjacent contact 22 within a given row 110 has second portions 72 of the contacts 22 extending in opposite directions. Arranging the contacts 22 in such an arrangement may align the tails 52 with a predetermined pad pattern on the circuit board 26 (shown in FIG. 1) for surface mounting. Arranging the contacts 22 in such an arrangement may evenly distribute mating forces of the contacts 22 with the circuit board 26. Arranging the contacts 22 in such an arrangement may allow for tighter spacing of the contacts 22. For example, such orientation changes the location of the grooves 116 within the contact cavities 44, thus reducing the spacing needed between adjacent contact cavities 44.

The housing 20 includes locating posts 120 extending from the board end 42. The locating posts 120 are received within holes (not shown) in the circuit board 26. In an exemplary embodiment, the locating posts 120 include interference features 122, such as ribs, along the posts 120. The interference features 122 engage the hole in the circuit board in an interference fit. The locating posts 120 thus hold the housing 20 with respect to the circuit board 26, such as during soldering and/or during use. The housing 20 includes a plurality of standoffs 124 extending from the board end 42. The standoffs 124 are used to position the housing 20 with respect to the circuit board 26. Optionally, standoffs 126 may be provided between each of the contact cavities 44 within a column 112 and/or a row 114. The standoffs 126 between the contact cavities 44 may support the housing 20. The standoffs 126 between the contact cavities 44 may provide shielding between the contacts 22.

During assembly, the housing 20, with the contacts 22, is mounted to the circuit board 26. The locating posts 120 are initially received in the holes in the circuit board 26 to align the housing 20 and contacts 22 with the circuit board 26. As the housing 20 is mounted to the circuit board 26, the tails 52 of the contacts 22 engage the circuit board 26. The tails 52 are flexed or bent such that the tails 52 are biased against the circuit board 26. For example, the second portions 72 are deflected relative to the first portions 70, such as at the intersection of the first and second portions 70, 72. The tails 52 thus operate as springs that are biased against the circuit board 26. In an exemplary embodiment, when the housing 20 is fully mounted to the circuit board 26 (e.g. the standoffs 124 engage the circuit board 26), the second portions 72 may be oriented at approximately a right angle with respect to the first portion 70. For example, the second portion 72 may be oriented generally parallel to the circuit board 26 such that the majority of the second portion 72 engages the circuit board 26.

In an exemplary embodiment, as the housing 20 is mounted to the circuit board 26, the interference features 122 of the locating posts 120 engage the holes in the circuit board 26 with an interference fit to hold the housing 20 relative to the circuit board 26. In an exemplary embodiment, the interference fit between the interference features 122 and the circuit board 26 is great enough to overcome the bias forces of the contacts 22 against the circuit board 26 to hold the housing 20 in position relative to the circuit board 26 during soldering.

Figure 5:
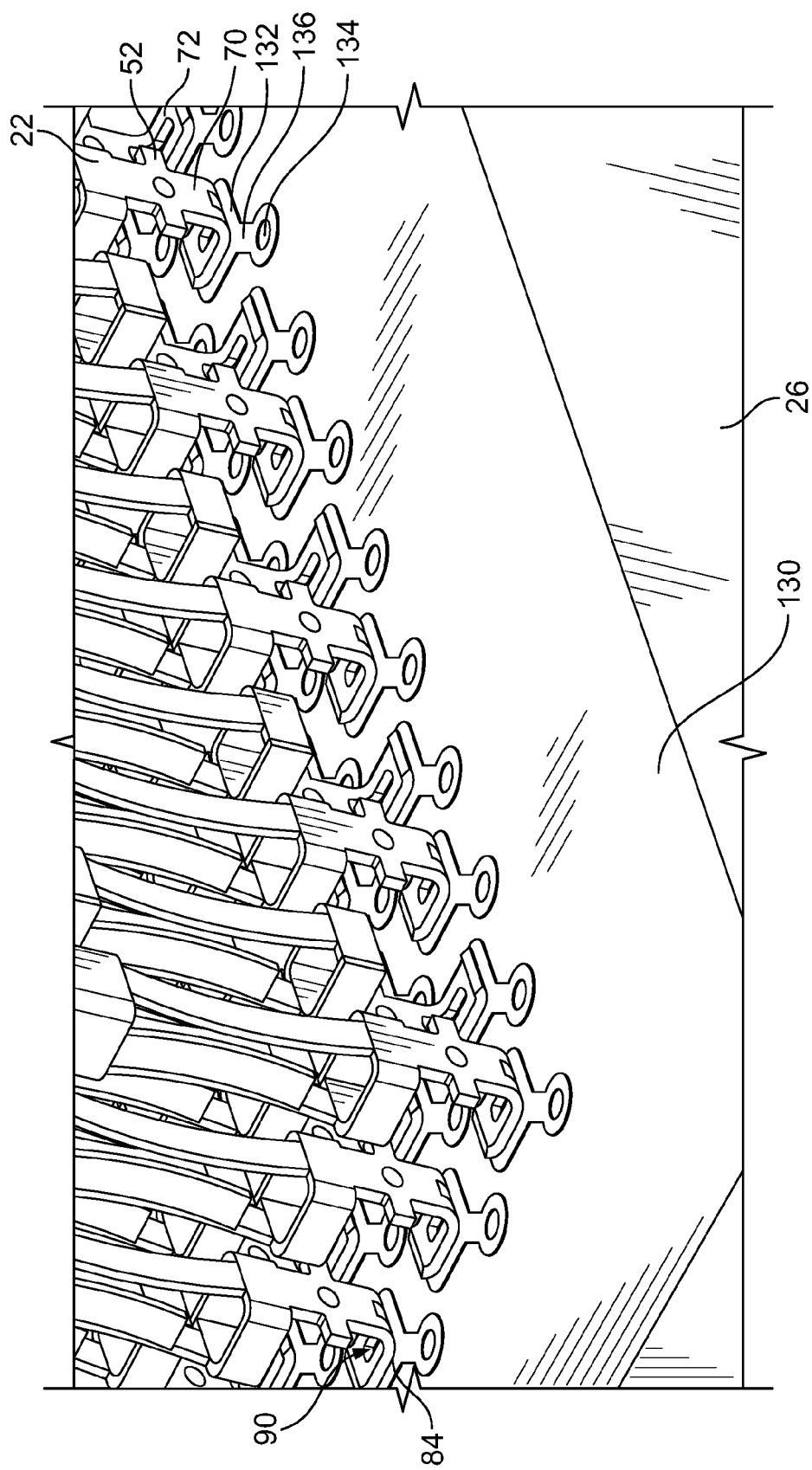
FIG. 5 illustrates the contacts mounted on a circuit board.

FIG. 5 illustrates a portion of the circuit board 26 with the socket contacts 22 mounted thereon with the housing 20 (shown in FIG. 1) removed for clarity. The contacts 22 are surface mounted to a mounting surface 130 of the circuit board 26. When mounted, the second portions 72 of the tails 52 are approximately at ninety degrees with respect to the first portions 70. The second portions 72 are generally coplanar with the mounting surface 130. As described above, during mounting of the connector 14, the tails 52 are flexed or bent such that the tails 52 are biased against the circuit board 26. The flexing of the tails 52 ensures engagement with the circuit board 26 during soldering of the tails 52 to the circuit board 26.

The circuit board 26 includes a mounting pad 132 for each contact 22. The mounting pad 132 is electrically connected with a via 134 by a trace 136. The vias 134 provide an electrical path for connecting to an internal layer and/or the opposite side of the circuit board 26.

In the illustrated embodiment, the mounting pads 132 are aligned with one another along columns and rows, however, the mounting pads 132 may be offset or staggered along columns and/or rows. The mounting pads 132 have a shape that complements the shape of the portion of the tail 52 surface mounted thereto. For example, the mounting pad 132 may have a generally square or rectangular shape. Other shapes are possible in alternative embodiments. The mounting pads 132 are sized to accommodate the tails 52 of the contacts 22. Optionally, the mounting pads 132 may be slightly larger in area than the tails 52 to accommodate slight misalignment or shifting of the contacts 22. In an exemplary embodiment, the mounting pads 132 are at least partially covered with a solder paste or a solder ball. During manufacture, the tails 52 are soldered to the mounting pads 132, such as by a reflow soldering process. The board mounting surface 84 is bonded to the mounting pad 132 by the solder. In an exemplary embodiment, at least a portion of the solder paste is configured to flow into or otherwise cover parts of the slot 90. For example, the solder may bond to sidewalls 138 of the slots 90, thus forming a bond to a surface of the tail 52 that is perpendicular to the mounting pad 132.

During use, the tails 52 are configured to flex, such as by deflecting at the intersection of the first and second portions 70, 72. Such flexing or bending accommodates relative movement of the contacts 22 and the circuit board 26, such as due to vibrations, thermal expansion, thermal stress, stresses from movement, handling and/or assembly, and the like.

Figure 6:
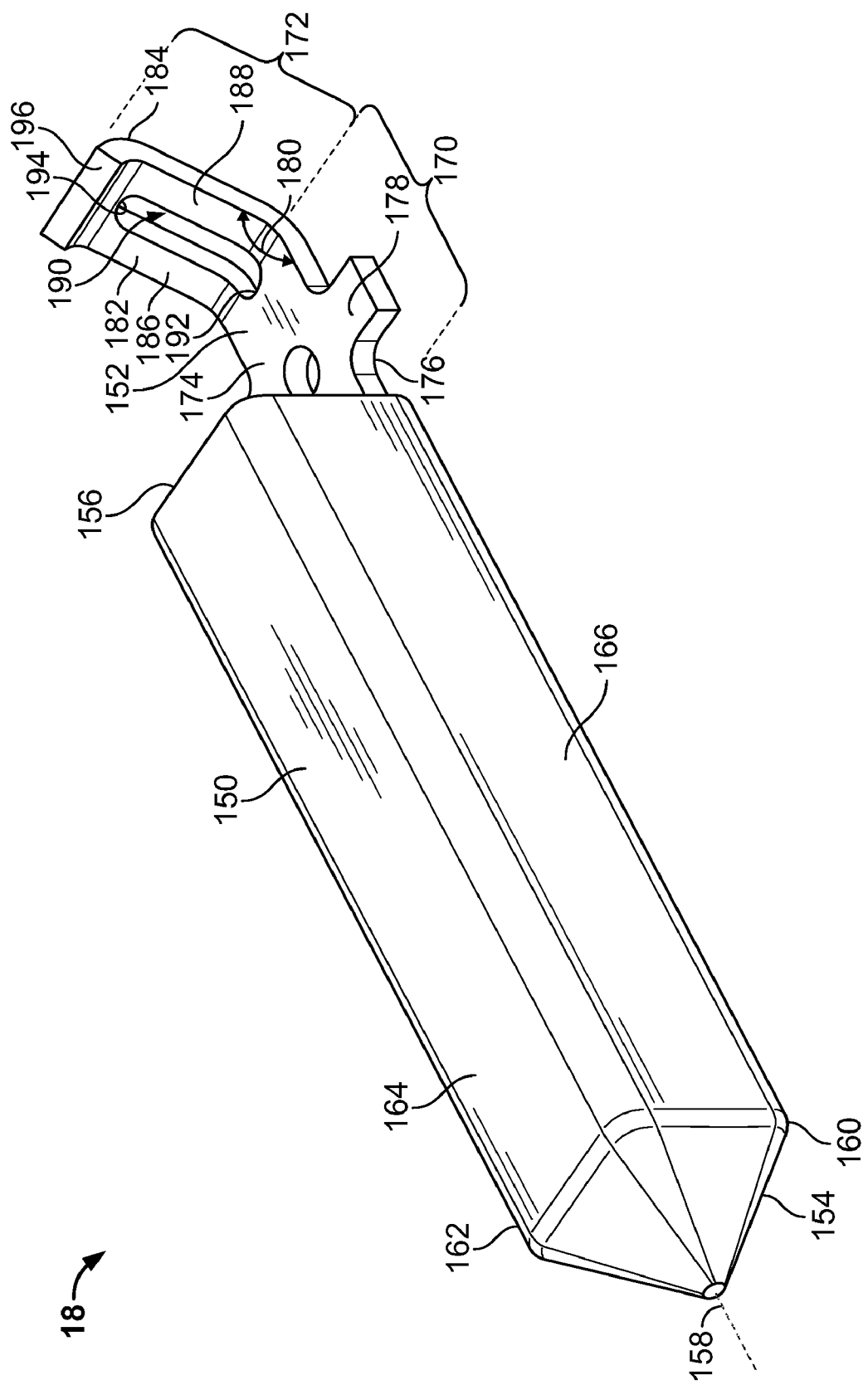
FIG. 6 is a perspective view of a contact for use with the header connector shown in FIG. 1.

FIG. 6 is a perspective view of one of the header contacts 18 for use with the header connector 12 (shown in FIG. 1). The header contact 18 includes a main body 150 and a flexible tail 152. The header contact 18 extends between a mating end 154 and a mounting end 156. The tail 152 is arranged at the mounting end 156. The main body 150 extends along a contact axis 158. The main body 150 includes first, second, third and fourth walls 160, 162, 164 and 166 forming a box-shaped contact. Optionally, each of the walls 160-166 has a substantially equal width thus forming a square-shaped cross-section. The main body 150 generally defines a post or pin that is configured to be plugged into the box-shaped receptacle of the socket contact 22 (shown in FIG. 3). Optionally, the header contact 18, including the main body 150, is stamped and formed into the box shape, however alternative means and processes may be used to manufacture the header contact 18.

In an exemplary embodiment, the first and third walls 160, 164 are generally opposed to one another and are configured to engage the primary beams 66 (shown in FIG. 3) of the header contacts 18. The second and fourth walls 162, 166 are generally opposed to one another and are configured to engage the secondary beams 68 (shown in FIG. 3) of the header contacts 18. In an exemplary embodiment, the walls 160-166 define a mating interface with at least four discrete contact points configured to engage the socket contact 22. For example, each wall 160-164 may define a contact point for the mating interface. The multiple contact points ensures good electrical connection between the contacts 22, 18.

The tail 152 extends from the main body 150 proximate the mounting end 156. The tail 152 is integrally formed with the main body 150, but may be separately provided in alternative embodiments. Optionally, the tail 152 may extend from the first wall 160. The tail 152 includes a first portion 170 extending along the contact axis 158 and a second portion 172 angled with respect to the first portion 170. Optionally, the first portion 170 may be generally coplanar with the first wall 160. The first portion 170 includes an inner surface 174 and an outer surface 176. In an exemplary embodiment, the first portion 170 includes a pair of pegs 178 that extend outward therefrom. Optionally, the first portion 170 includes a pair of retention barbs that extend outward therefrom.

The second portion 172 extends from the first portion 170 at an angle 180. Optionally, the angle 180 may be an acute angle and formed such that the second portion 172 is angled generally toward the contact axis 158 from the first portion 170. As will be described in further detail below, the second portion 172 forms a spring. Optionally, the first and second portions 170, 172 may cooperate to define a spring. The second portion 172 includes an inner surface 182 and an outer surface 184. In an exemplary embodiment, the outer surface 184 defines a board mounting surface and when the contact 18 is mounted to the circuit board 24 (shown in FIG. 1), the board mounting surface extends along and engages the circuit board 24. The contact 18 may be mounted to the circuit board 24 in a similar manner the contact 22 is mounted to the circuit board 26.

The second portion 172 includes first and second legs 186, 188 separated from one another to define a slot 190. Optionally, the slot 190 may extend entirely through the second portion 172 between the inner and outer surfaces 182, 184. Alternatively, the slot 190 may be open to the outer or board mounting surface 184 and extend only partially from the outer surface 184 to the inner surface 182. The slot 190 has a top 192 and a bottom 194. The legs 186, 188 are connected at the end of the tail 152 to define the bottom 194 of the slot 190, however, the slot 190 may extend all the way to the end of the tail 152 in alternative embodiments. The top 192 of the slot 190 may be positioned generally at the intersection of the first and second portions 170, 172, however the top 192 may be positioned in either the first portion 170 in an alternative embodiment such that the slot 190 extends at least partially along the first portion 170. The intersection of the first and second portions 170, 172 is generally defined at the bend forming the angle 180. The tail 152 includes a tip 196 at the distal end of the tail 152. Optionally, the tip 196 may be curved.

A connector system 10 is thus provided that may be manufactured in a cost effective and reliable manner. The connector system 10 includes the header connector 12 and the receptacle connector 14. Each connector 12, 14 includes contacts 18, 22 that are surface mounted to circuit boards 24, 26, respectively. With reference to the socket contact 22, the contact 22 includes a flexible tail 52 that include first and second portions 70, 72. The second portion 72 is angled with respect to the first portion 70. During mating with the circuit board 26, the tail 52 is flexed or deflected such that the tail 52 is biased against the circuit board 26. The tail 52 thus operate as a spring. The spring action of the tail 52 operates to hold the tail 52 against the circuit board for soldering. The spring action of the tail 52 also accommodates relative movement of the contacts 22 and the circuit board 26, such as due to vibrations, thermal expansion, thermal stress, stresses from movement, handling and/or assembly, and the like. The tail 52 includes a slot 90. When mounted to the circuit board 26, the solder paste is configured to at least partially flow into the slot 90, thus increasing the surface area of the tail 52 that bonds to the solder. The strength of the bond between the contact 22 and the circuit board 26 is increased with the bonding of the solder to the surfaces of the slot 90. The housing 20 includes locating posts 120 that are held within holes in the circuit board 26 by an interference fit, such as to hold the housing 20 during soldering and/or during handling or use.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector comprising:
a housing having a mating end and a board end, the housing having a plurality of contact cavities extending along a longitudinal axis between the mating and board ends, the contact cavities are arranged in a plurality of rows and a plurality of columns; and
a plurality of contacts received in the contact cavities such that each contact in a column faces in a common direction and adjacent contacts within a row face in different directions the contacts having a mating end and a mounting end, the contacts having a flexible tail at the mounting end, wherein the contact has a main body, the tail extending from the main body, the main body having a generally box shape, the tail having a first portion extending along the longitudinal axis and a second portion angled with respect to the first portion, the second portion having a board mounting surface configured to mount to a circuit board, the second portion engaging the circuit board wherein the tail includes a slot through the first and second portions, the slot being open along the board mounting surface and being configured to receive solder for soldering the contact to the circuit board, wherein the tails are deflected as the housing is mounted on the circuit board such that the second portion is biased against the circuit board to ensure contact with the circuit board during soldering of the tails to the circuit board.

2. The electrical connector of claim 1, wherein the tail includes a bend at the intersection of the first and second portions, the slot extends through the bend along the first portion and the second portion, the slot receiving solder in both the first portion and the second portion.

3. The electrical connector of claim 1, wherein the tail includes first and second legs separated from one another to define the slot, the first and second legs defining segments of the first and second portions of the tail.

4. The electrical connector of claim 1, wherein the board mounting surface is generally planar for surface mounting to the circuit board such that a majority of the slot rests on the circuit board to receive solder for soldering to the circuit board.

5. The electrical connector of claim 1, wherein the contacts are initially loaded into the contact cavities such that the second portion is angled at an acute angle with respect to the first portion, the housing being mounted to the circuit board such that the tails are flexed such that the second portion is angled at approximately a right angle with respect to the first portion.

6. The electrical connector of claim 1, wherein the tails are deflected as the housing is mounted to the circuit board such that the second portion is biased against the circuit board to ensure contact with the circuit board during soldering of the tails to the circuit board.

7. The electrical connector of claim 1, wherein the contact cavities are box shaped and include four walls of substantially equal width, the first portion extending along one of the walls.

8. The electrical connector of claim 1, wherein the contact has a main body, the tail extending from the main body, the main body having a generally box shape.

9. The electrical connector of claim 1, wherein the contact has a main body, the tail extending from the main body, at least a portion of the main body extending from and beyond the mating end of the contact cavity.

10. The electrical connector of claim 1, wherein the first portion includes a peg extending outward, each contact cavity includes a groove formed in a wall defining the contact cavity, the peg received within the groove.

11. The electrical connector of claim 1, wherein the slot extends along both the first and second portions through the transition between the first and second portions.

12. A contact for surface mounting to a circuit board, the contact comprising:
a main body having a box-shape, the main body including a first collar and a second collar, the main body including beams extending at least partially between the collars, the collars and beams defining a receptacle for receiving the mating contact, the main body extending along a contact axis, the main body having a mating interface with at least four discrete contact points configured to engage a mating contact, wherein the mating contact is configured to engage each beam; and
a flexible tail extending from the main body, the tail including a first portion extending along the contact axis and a second portion angled with respect to the first portion, the second portion having a board mounting surface configured to mount on the circuit board, the second portion of the tail being deflected and flexed during surface mounting to the circuit board such that an angle between the first and second portions changes during mounting to the circuit board, wherein the second portion is initially angled at an acute angle with respect to the first portion, and wherein the second portion is angled at approximately a right angle with respect to the first portion when the tail is soldered to the circuit board, the second portion being biased against the circuit board to ensure contact with the circuit board during soldering of the tail to the circuit board, wherein the tail includes a slot open along the board mounting surface.

13. The contact of claim 12, wherein the tail includes first and second legs separated from one another to define the slot, the first and second legs defining segments of the first and second portions.

14. The contact of claim 12, wherein the slot extends along both the first and second portions through the transition between the first and second portions.

15. The contact of claim 12, wherein the board mounting surface engages the circuit board.

16. An electrical connector comprising:
a housing having a mating end and a board end configured for mounting to a circuit board, the housing having a plurality of contact cavities extending along a longitudinal axis between the mating and board ends, the contact cavities being arranged in a plurality of rows and a plurality of columns; and
a plurality of contacts received within the contact cavities, the contacts received in the contact cavities such that each contact in a column faces in a common direction and adjacent contacts within a row face in different directions, each contact having a mating end and a mounting end, the contact having a main body at the mating end having a generally box shape, each contact having a flexible tail at the mounting end, the tail having a board mounting surface configured to mount to the circuit board, wherein the tail is deflected as the contact is mounted on the circuit board such that the tail is biased against the circuit board.

17. The electrical connector of claim 16, wherein the housing has a locating post extending from the board end, the locating post being configured to be interference fit within holes in the circuit board, and wherein the interference fit between the locating post and the circuit board is great enough to overcome the bias forces of the contacts to hold the housing in position relative to the circuit board during soldering, the locating posts having interference features extending outward therefrom, the interference features provide the interference fit with the circuit board.

18. The electrical connector of claim 16, wherein each tail includes a first portion extending along a longitudinal axis and a second portion angled with respect to the first portion, the second portion having the board mounting surface engaging the circuit board, the tail includes a slot through the first and second portions, the slot being open along the board mounting surface, the slot being configured to receive solder for soldering the contact to the circuit board.

19. The electrical connector of claim 16, wherein the contact includes a peg extending outward, each contact cavity includes a groove formed in a wall defining the contact cavity, the peg received within the groove to hold the contact relative to the contact cavity.

* * * * *